United States Patent
Lo Presti et al.

(10) Patent No.: US 9,107,331 B2
(45) Date of Patent: Aug. 11, 2015

(54) INTELLIGENT POWER MODULE AND RELATED ASSEMBLING METHOD

(75) Inventors: Matteo Lo Presti, Misterbianco (IT); Nunzio Abbate, Catania (IT); Agatino Minotti, Mascalucia (IT); Mario Di Guardo, Gravina di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 413 days.

(21) Appl. No.: 13/527,377

(22) Filed: Jun. 19, 2012

(65) Prior Publication Data

US 2012/0320545 A1 Dec. 20, 2012

(30) Foreign Application Priority Data

Jun. 20, 2011 (IT) .............................. MI11A001114

(51) Int. Cl.

| | |
|---|---|
| *H01R 9/00* | (2006.01) |
| *H05K 3/32* | (2006.01) |
| *H05K 1/14* | (2006.01) |
| *H05K 7/14* | (2006.01) |
| *H01L 23/498* | (2006.01) |
| *H01L 25/16* | (2006.01) |
| *H05K 3/30* | (2006.01) |
| *H01L 23/373* | (2006.01) |

(52) U.S. Cl.
CPC .......... *H05K 3/325* (2013.01); *H01L 23/49811* (2013.01); *H01L 25/162* (2013.01); *H05K 1/145* (2013.01); *H05K 7/1432* (2013.01); *H01L 23/3735* (2013.01); *H01L 2224/48091* (2013.01); *H01L 2924/1305* (2013.01); *H01L 2924/13055* (2013.01); *H01L 2924/13091* (2013.01); *H05K 3/308* (2013.01); *Y10T 29/49002* (2015.01)

(58) Field of Classification Search
USPC ........................ 361/772–774, 790–795, 803; 439/76.1–76.2; 257/690–692
See application file for complete search history.

(56) References Cited

U.S. PATENT DOCUMENTS

| | | | | |
|---|---|---|---|---|
| 6,421,244 | B1 * | 7/2002 | Shinohara et al. ............ | 361/736 |
| 6,521,983 | B1 * | 2/2003 | Yoshimatsu et al. .......... | 257/678 |
| 6,995,461 | B2 * | 2/2006 | Soyano et al. ................ | 257/678 |
| 7,663,886 | B2 * | 2/2010 | Aoki et al. .................... | 361/715 |
| 2003/0067749 | A1 * | 4/2003 | Tamba et al. .................. | 361/699 |
| 2008/0122075 | A1 | 5/2008 | Bauer et al. | |
| 2008/0142571 | A1 | 6/2008 | Yokozuka et al. | |
| 2009/0086455 | A1 * | 4/2009 | Sakamoto et al. ............ | 361/796 |
| 2010/0127371 | A1 | 5/2010 | Tschirbs | |

* cited by examiner

*Primary Examiner* — Tuan T Dinh
(74) *Attorney, Agent, or Firm* — Seed IP Law Group PLLC (57) ABSTRACT

An intelligent power module includes a power circuit board having a plurality of power devices and fixed on a base plate of a case body able to be closed with a lid to form a protective case of the intelligent power module. The intelligent power module also includes a control circuit board suitable to drive the power devices of the power circuit board. The control circuit board is associated with the lid in such a way that the control circuit board is comprised within the case body. The control circuit board and the lid thus realizing an intelligent lid of the intelligent power module.

26 Claims, 6 Drawing Sheets

INTELLIGENT POWER MODULE AND RELATED ASSEMBLING METHOD

BACKGROUND

1. Technical Field

The present disclosure relates to an intelligent power module (IPM) and a related assembling method.

The disclosure refers, in particular, but not exclusively, to an intelligent power module comprising a control circuit board and a power circuit board as well as a body case closed by a lid in order to package the boards, and the following description is made with reference to this field of application for convenience of explanation only.

2. Description of the Related Art

As is known, in the technical field of the power modules, intelligent power modules (IPM) combine application-specific insulated-gate bipolar transistors (IGBTs) and diodes, control functions, smart protections and extra optional features.

In recent years, the use of intelligent power modules has rapidly increased, in particular in motor drive applications, thanks to the benefits of greater integration levels. In this field, for instance, an intelligent power module may be connected to a microcontroller in order to convert the microcontroller output into the correct high-power waveform to drive a motor. In particular, intelligent power modules are advanced hybrid power devices designed to integrate high speed and low loss IGBTs with dedicated drive circuitry for AC motor control, usually implemented on a printed circuit board (PCB).

In its more general form, an intelligent power module usually comprises a power portion in the form of a power circuit board, comprising power devices, and a control portion in the form of a control circuit board for the driving and monitoring of the power circuit board, such as a gate driver printed circuit board (PCB) for driving the power devices of the power circuit board. In particular, the gate driver PCB may be located on a direct-bond copper (DBC) substrate.

Naturally, it is desired to electrically connect the control circuit board and the power circuit board by means of bonds that introduce low values of resistance, and withstand—without melting—the passage of high currents, in the range of 150-200 A. This desire is particularly felt in the case of so-called power packages, which are commonly used for packaging integrated circuits that form devices with high current consumption, such as for example power diodes, low-voltage power MOSFETs, or else insulated-gate bipolar transistors (IGBTs).

Concerning the electrical connections between the control circuit board and the power circuit board of the intelligent power module, it is well known that they are commonly realized either through wire-bonding or clip-bonding techniques.

Figure 1:
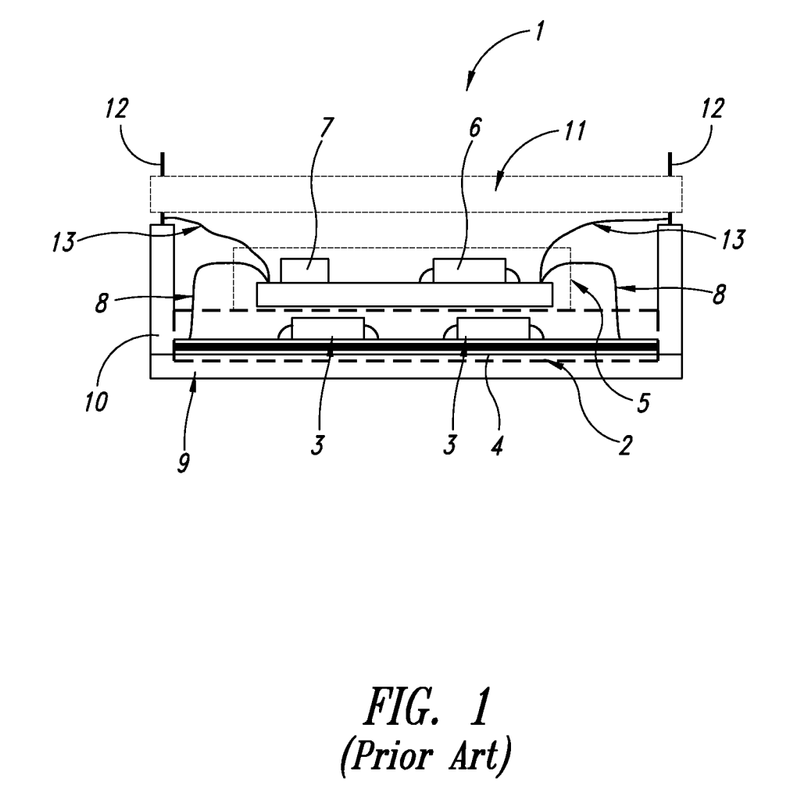
FIG. 1 schematically shows an intelligent power module (IPM), being realized according to the prior art.

By way of example, FIG. 1 is a schematic illustration of an intelligent power module (IPM) 1 realized according to the prior art.

The intelligent power module 1 comprises:
  a power circuit board 2, in turn including power devices, such as switches, globally indicated with 3; the power devices 3 are provided on a substrate, in particular a direct copper bond substrate 4; and
  a control circuit board 5, in particular a gate driver PCB, for driving the power circuit board 2, the control circuit board 5 in turn including gate driver components 6 and at least a logic block 7.

In particular, the control circuit board 5 is connected to the power devices 3 by appropriate bonding wires 8. Both the control circuit board 5 and the power circuit board 2 are protected by a protective case or package, formed by:
  a base plate 9, to which a radiating heat sink, not shown in the figure, is also normally attached;
  a case body 10; and
  a lid 11, usually made of an insulating material, the lid closing the case body and thus completing a package of the intelligent power module 1.

The case body 10 comprises leads 12 located at its periphery in dedicated positions of its internal walls. The leads 12 are connected to the control circuit board 5 through bonding wires 13 to enable proper operation of the power circuit board 2 and of the electronic circuits provided therein. The leads 12 have connection terminals which exit from the lid 11 through suitable holes provided at the periphery of the lid 11 itself, enabling the connection of the control circuit board 5 to the outside world.

For the purpose of connection between the power circuit board 2 and the control circuit board 5 and between the control circuit board 5 and the external world, among other techniques, bonding wires or clips bonding may be used.

As regards to the wire bonding technique, it is likewise possible to distinguish between thin-wire bonding and heavy-wire bonding; in either case, the bonding is carried out by means of a wire-like connection element of conductive material, usually having a circular section.

As regards to the clip bonding technique, the bonding is carried out by means of so-called clips, i.e., strips of conductive material (typically, copper), so as to obtain an almost planar connection element of conductive material.

For the assembly of an intelligent power module, the control circuit board may be a generic printed circuit board comprising at least a logic block. In particular, as it is known, the logic block comprises electrical components that are put into the printed circuit board and interconnected to each other using any one of the following different technologies:
  the "through holes" technology, in which the printed circuit board is manufactured with plated through holes; these holes are used as references for placing the electrical components which, once installed, may be soldered into position using either manually, wave- or reflow-soldering techniques. In this case, small connectors may be packaged on a tape and reel for surface mount device placement by standard pick and place machines;
  the "surface mounted" technology, also known as Surface Mount Device (SMD) technology, in which, before the electrical components are placed on the printed circuit board, solder paste is applied to the pads of the component and/or the board itself; the board is then passed through a solder reflow oven; or
  the "press-fit" technology, in which pins of press-fit connectors are pressed into metalized, namely plated, through-holes in the printed circuit board by applying a mechanical force; due to the high radial pressure, the press-fit pins are deformed, when pressed in the holes, resulting in a gas-tight electrical connection between each press-fit pin and the corresponding metalized through-hole.

In their more general form, the press-fit connectors comprise an elastic core acting as a spring and are tin plated for enhancing the electrical contact performance; they may have different shapes. It should be underlined that press-fit pins, due to their elastic and conductive features, may thus ensure good mechanical stability and electrical contact.

Figure 2A:
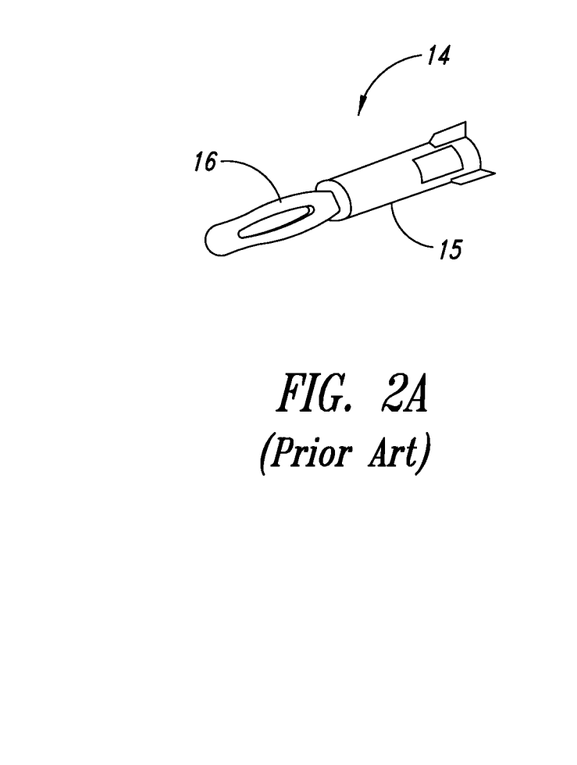
FIGS. 2A and 2B schematically show a 3D and a cross section, respectively, of a press-fit connector, being realized according to the prior art.
Figure 2B:
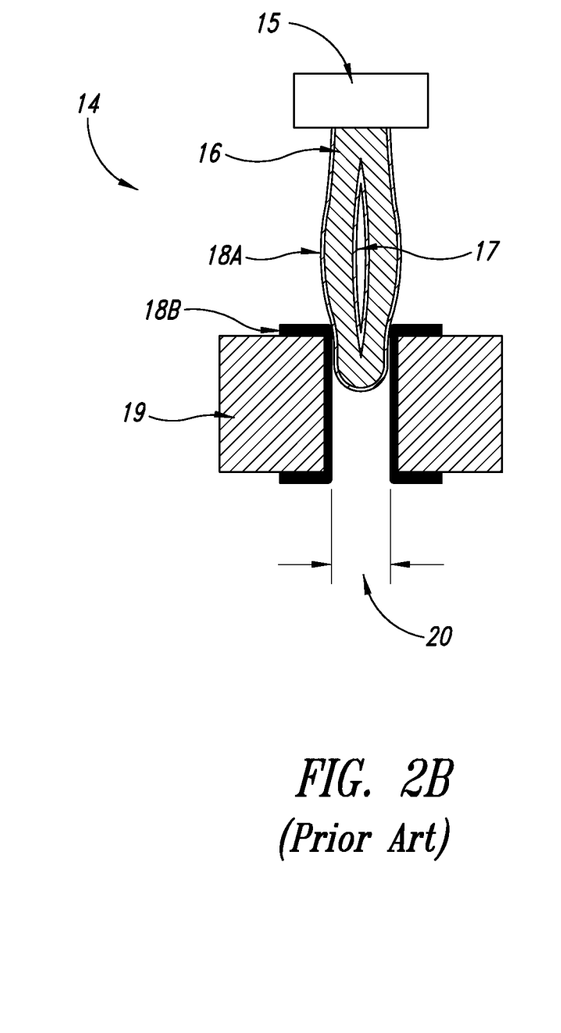

By way of example, FIGS. 2A and 2B are schematic illustration of a press-fit connector 14 of the known type. More in particular, the press-fit connector 14 comprises a tubular body 15 and a needle 16 having at least one eye 17 so as to act as a spring core, and a metal plating layer 18A, in particular a copper layer, provided outside the needle 16. Another metal plating layer 18B is provided on the walls of a suitable hole 20 in a PCB 19 for receiving the needle 16 of the press-fit connector 14.

It is also well known that, according to the known method of assembling intelligent power modules, the control circuit board is located inside the case body, over the power circuit board, and molded to the case body by an epoxy resin using a molding process.

Due to this architecture, the known intelligent power modules show different problems, mainly tied to the huge number of bonding wires to be suitably placed inside the case body thereof in order to ensure multiple interconnections between the different elements composing the module itself.

Moreover, the use of such bonding wires also involves different disadvantages such as:

(a) the module has a low input/output count due to the limitations of the wire bonding technology, (b) the module needs to be provided with large bonding pads, that are also at a sufficient distance (pitch) one another, (c) relatively large quantities of gold are involved in the assembling process, (d) the assembling process shows a low production rate, (e) the connection provided by wire bonding has relatively poor electrical performance, (f) difficulties arise, when variations in bond geometry are needed, and (g) robustness and reliability problems are brought about by environmental conditions.

In addition, both the wire bonding and the clip bonding involve a very high assembly complexity.

Moreover, according to the prior art solutions, any time the control circuit has to be changed, for instance based on a new desired/required electronic function, a new dedicated intelligent power module has to be fabricated, with an evident impact on the production costs.

BRIEF SUMMARY

Some embodiments of the present are an intelligent power module and a related assembling method having structural and functional characteristics which allow to overcome the limits which still affect the modules realized according to the prior art.

One embodiment of the present disclosure is an intelligent power module comprising a generic control circuit board and a power circuit board which is assembled with a lid of the case body of the module. The lid thus becomes an intelligent lid, namely a lid comprising the control circuit board. The electrical connection between the control circuit board comprised in the lid and the power circuit board comprised in the case body of the module is realized through press-fit connectors, eliminating at least one level of wire bonding.

One embodiment of the present disclosure is an intelligent power module including at least a power circuit board having a plurality of power devices and being fixed on a base plate of a case body able to be closed with a lid to form a protective case of the intelligent power module and a control circuit board suitable to drive the power devices of the power circuit board. The control circuit board is coupled to the lid of the protective case of the intelligent power module in such a way that the control circuit board is comprised within the case body when the lid closes it, the control circuit board and the lid thus realizing an intelligent lid of the intelligent power module.

More in particular, the disclosure comprises the following supplemental and optional features, taken alone or in combination.

According to an aspect of the disclosure, the intelligent power module may further comprise press-fits fixed on multiple positions realized in the internal walls of the case body, the press fits respectively having a body, a needle with at least one eye and a protrusion extending from the needle in an opposite direction with respect to the body The at least one eye and the protrusion being directed toward the lid and the body being directed toward and electrically connected with the power circuit board, the control circuit board comprising a first plurality of through-holes and the lid having a second plurality through-holes matching with the through-holes of the first plurality, the protrusions of the needles of the press-fits passing through the first and second plurality of through-holes and emerging from the lid when the lid close the intelligent power module so as to realize output terminals of the intelligent power module able to be used for the connection of the power circuit board with the outside world.

According to another aspect of the disclosure, the body of each press-fit may be connected to at least one power device of the power circuit board through wires.

According to yet another aspect of the disclosure, at least some of the through-holes may be metalized. Alternatively all through-holes may be metalized.

Furthermore, the metalized through-holes may comprise respective rivets being substantially L-shaped and having one leg disposed along a wall of the respective through-hole and another leg disposed on the control circuit board.

According to another aspect of the disclosure, the intelligent power module may comprise at least a first control circuit board and a second control circuit board, as well as an insulating layer, the first printed circuit board being attached to a surface of the lid facing the power circuit board, the insulating layer being provided on the first printed circuit board on its opposed face and the second printed circuit board being realized on the insulating layer, an intelligent lid comprising the first and second control circuit boards being so obtained.

According to yet another aspect of the disclosure, the intelligent power module may further comprise:

press-fits of a first type fixed on multiple positions realized in the internal walls of the case body, the press fits of the first type respectively having a body, a needle with more than one eye and a protrusion extending from the needle in an opposite direction with respect to the body, the eyes and the protrusion being directed toward the lid and the body being directed toward and electrically connected with the power circuit board; and press-fits of a second type fixed on multiple positions realized in the internal walls of the case body, the press fits of the second type respectively having a body, a needle with at least one eye, the body being directed toward and electrically connected with the power circuit board;

the first and second control circuit boards comprising respective first plurality of through-holes and the lid having a second plurality through-holes matching with the through-holes of the first plurality;

the protrusion of the needles of the press-fits of the first type passing through the first and second plurality of through-holes and emerging from the lid when the lid close the intelligent power module so as to realize output terminals of the intelligent power module able to be used for the connection of the power circuit board with the outside world.

Moreover, the intelligent power module may further comprise leads extending from the first control circuit board, passing through the second plurality of through-holes and emerging from the lid when the lid close the intelligent power module.

In particular, at least one of the power circuit board and control circuit boards may be in the form of a printed circuit board.

According to another aspect of the disclosure, the power circuit board may be provided, inside the protective case on a substrate, of the direct copper bond type, the substrate comprising a first and a second metallic layer on its both sides, the second metallic layer being in contact with the power circuit board.

According to a further aspect of the disclosure, the power circuit board may be positioned in a central area of the base plate and may occupy between 75% and 95% of its area, preferably at least 90% of its area.

Yet according to another aspect of the disclosure, the intelligent power module may further comprise a galvanic isolation block so as to realize a galvanic intelligent power module.

in particular, the galvanic isolation block may be positioned in the control circuit board.

Moreover, the control circuit board may comprise output terminals going out from the lid providing specific signals, such as alarm signals.

According to another aspect of the disclosure, the control circuit board may be integrated inside the lid.

One embodiment of the present disclosure is a method of assembling an intelligent power module, comprising the steps of:
   providing a power circuit board fixed on a base plate of a case body able to be closed with a lid to form a protective case of the intelligent power module;
   providing a control circuit board for driving the power circuit board;
   associating the control circuit board with the lid in such a way that the control circuit board is comprised within the case body when the lid close it
   the control circuit board associated with the lid thus realizing an intelligent lid.

According to an aspect of the disclosure, the method may further comprise the steps of:
   positioning press-fits on multiple positions comprised in the internal walls of the case body, the press fits comprising a body, a needle with at least one eye and a protrusion extending from the needle in an opposite direction with respect to the body, the at least one eye and the protrusion being directed toward the lid and the body being directed toward and electrically connected with the power circuit board;
   providing the control circuit board with a plurality of through-holes;
   providing the lid with multiple holes able to match with the through-holes of the control circuit board; and
   closing and blocking the case body with the intelligent lid by means of the press-fits whose protrusions exit from the intelligent lid and act as output terminals of the intelligent power module enabling the connection of the power circuit board with the outside world.

According to another aspect of the disclosure, the press-fits may be fixed at a certain distance over the power circuit board, this distance being related to the working voltage level of the intelligent power module.

According to yet another aspect of the disclosure, the step of associating the control circuit board with the lid may comprise the step of bonding the control circuit board to the surface of the lid facing the power circuit board.

Alternatively, the step of associating the control circuit board with the lid may comprise the steps of:
   bonding a first printed circuit board to the surface of the lid facing the power circuit board;
   forming an insulating layer on the first printed circuit board; and
   bonding a second printed circuit board on the insulating layer.

According to a further aspect of the disclosure, the step of associating the control circuit board with the lid may comprise the step of integrating the control circuit board inside the lid.

Moreover, according to an aspect of the disclosure, the step of closing and blocking the case body with the intelligent lid may comprise the step of pressing the lid on the case body in such a way that the at least one eye of the needle of the press-fits passes through the through-holes, resulting in a gas-tight electrical connection between the press-fit and the through-holes.

According to another aspect of the disclosure, the power circuit board and the control circuit board are coupled each other cutting the protrusion at a lid level.

According to yet another aspect of the disclosure, the step of closing and blocking the case body with the intelligent lid may comprise the step of pressing the lid on the case body in such a way that at least a lead passes through a non-metalized hole of the second control circuit board.

Finally, the method may further comprise a step of inserting a galvanic isolation block in the control circuit board.

The characteristics and advantages of intelligent power modules according to the present disclosure will be apparent from the following description of an embodiment thereof given by way of indicative and non-limiting example with reference to the annexed drawings.

DETAILED DESCRIPTION

Figure 3:
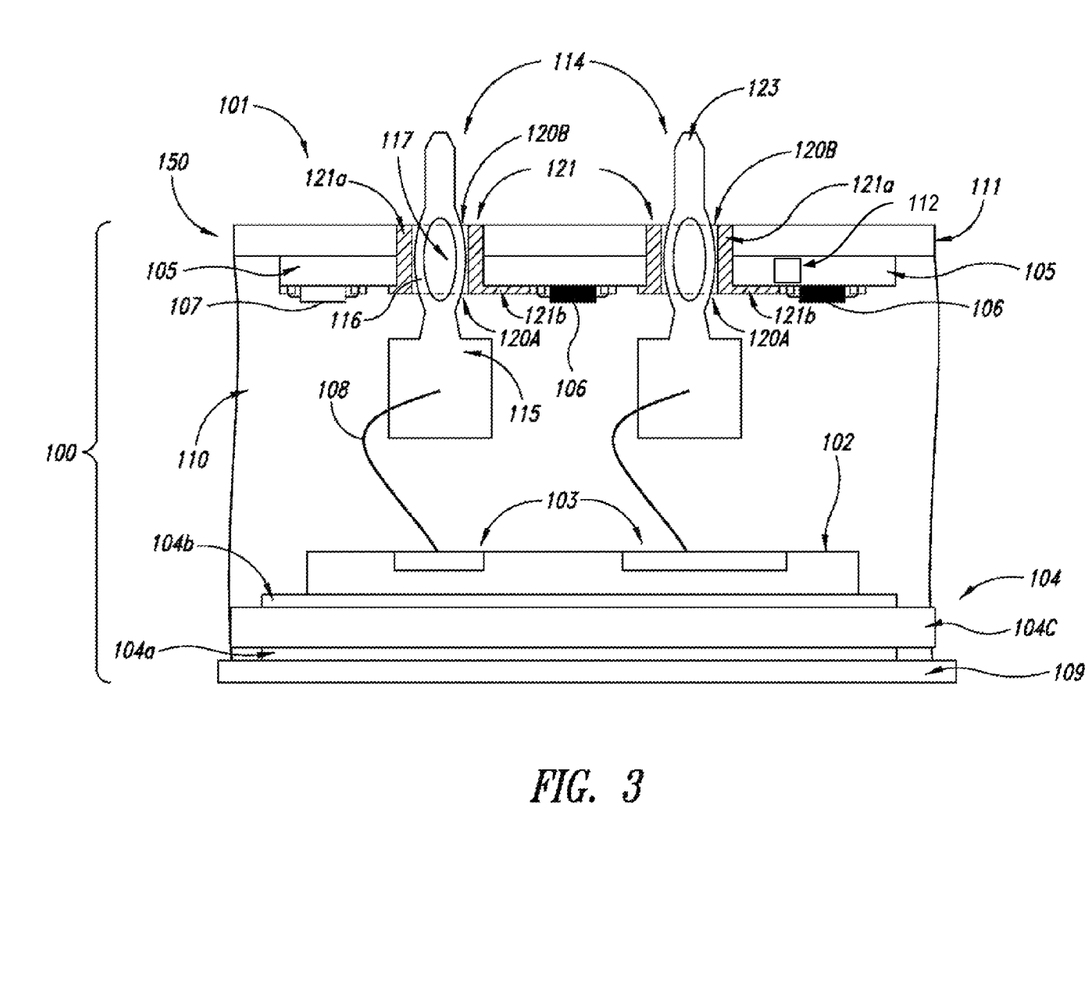
FIG. 3 schematically shows a cross section of an intelligent power module, being realized according to a first embodiment of the disclosure.

With reference to such figures, and in particular to FIG. 3, an intelligent power module 101 obtained according to a first embodiment of the method of the present disclosure is shown.

In particular, the intelligent power module 101 comprises a power circuit board 102, in turn including, for instance, power devices 103. The power circuit board 102 is provided, inside a protective case 100, on a substrate 104, in particular a direct copper bond substrate. More in particular, the substrate 104 comprises a substrate body 104C and first and second metallic layers 104a and 104b on opposite sides of the substrate body, the second metallic layer 104b being in contact with the power circuit board 102.

The protective case 100 of the intelligent power module 101 is includes a base plate 109, a case body 110 with a central opening, and a lid 111 to close the opening of the case body 110, the lid 111 being in particular made of an insulating material.

More in particular, the base plate 109 is connected to the first metallic layer 104a of the substrate 104 and normally attached to a radiating heat sink (not shown in the figure).

The power circuit board 102 is positioned in the central area of a surface of the base plate 109 and occupies a high percentage of surface of the base plate, in particular in the range of 75-95% and preferably equal to at least the 90%.

The intelligent power module 101 also comprises a control circuit board 105, in particular a gate driver PCB, provided for the driving of the power devices 103 and associated with the lid 111.

The control circuit board 105 comprises, for instance, gate driver components 106 and at least a logic block 107.

The control circuit board 105 is attached, for instance by means of known bonding techniques, to the surface of the lid 111 facing the power circuit board 102.

The control circuit board 105 may be also realized within the lid 111.

In such a way an intelligent lid 111 integrating the control circuit board 105 is obtained.

Press-fits 114 are positioned at multiple positions in the internal walls of the case body 110 and are adequately patterned in such a way to allocate each press-fit 114 at a certain distance over the power circuit board 102. In particular, such a distance ranges between 2 mm and 4 mm. Obviously, the value of this distance is related to the voltage level that the intelligent power module 101 should sustain.

A press-fit 114 comprises a body 115 and a needle 116 having at least one eye 117, as well as a protrusion or tip 123 extending from the needle 116 in an opposite direction with respect to the body 115. In particular, the body 115 may be tubular. Moreover, plane portions may be provided into the tubular body 115, in particular suitable for allowing a wire bonding of the same.

More specifically, the press-fits 114 are positioned in their patterned dedicated positions with the eye 117 of the needle 116 extending through the lid 111 of the protective case 100, the protrusion 123 extending outwardly from the lid 111, and the body 115 extending toward the base plate 109 of the protective case 100.

Moreover, the body 115 of each press-fit 114 is connected to at least one power device 103 of the power circuit board 102 through wires 108. Alternatively, clips (not shown) may be used to connect the body 115 of the press-fits 114 with the power devices 103 of the power circuit board 102.

The control circuit board 105 further comprises suitably metalized holes 120A through which the press-fits 114 are pressed. In particular, the metalized holes 120A have walls covered by metallic rivets 121 that are substantially L-shaped and have one leg 121a positioned along a wall of the hole 120A and another leg 121b positioned on the control circuit board 105 toward the closest gate driver component 106. In particular the second leg 121b is an extension made of copper and is able to realize an electrical connection with the gate driver component 106. Such an electrical connection may be also simply realized by the pressing of the metallic rivet 121 onto a cover metallic layer of the control circuit board 105. In FIG. 3, the control circuit board 105 comprises two metalized holes 120A only for sake of illustration.

Advantageously according to another aspect of the disclosure, the control circuit board 105 comprises said plurality of metalized holes 120A mainly disposed along its perimeter.

The lid 111 is also provided with multiple holes 120B realized along its perimeter in such a way to match the metalized holes 120A of the control circuit board 105 when the lid 111 and the control circuit board 105 are put together face by face. The first leg 121a of each rivet 121 extends through one of the holes 120A and through a corresponding one of the holes 120B in the lid 111.

After its manufacturing and assembling with the control circuit board 105, the intelligent lid 111 is put on the case body 110 to cover and close the opening in the protective case 100 of the intelligent power module 101. More in particular, the intelligent lid 111 is pressed on the case body 110 in such a way that the eyes 117 of the needles 116 of the press-fits 114 pass through the metalized holes 120A, 120B, deforming themselves, thus ensuring the mechanical blocking of the intelligent lid 111 on the case body 110 and resulting in a gas-tight electrical connection between the press-fits 114 and the corresponding metalized holes 120A, 120B.

As already explained, one embodiment of the present application s a method for assembling the intelligent power module 101 comprising the steps of:
  providing the power circuit board 102 fixed on the base plate 109 of the case body 110, which is able to be closed with the lid 111;
  providing the control circuit board 105 for driving the power circuit board 102; and
  associating the control circuit board 105 with the lid 111 in such a way that the control circuit board 105 is comprised within the case body 110 when the lid 111 closes it,
  the control circuit board 105 integrated with the lid 111 thus realizing an intelligent lid 150.

The assembling method further advantageously comprises the steps of:
  positioning the press-fits 114 at multiple positions in the internal walls of the case body 110, with the eye 117 of the needle 116 directed toward the lid 111 and the body 115 directed toward and electrically connected with the power circuit board 102;
  providing the control circuit board 105 with a plurality of through-holes 120, in particular along its perimeter;
  providing the lid 111 with multiple holes along its perimeter able to match with the through-holes 120 of the control circuit board 105;
  integrating the control circuit board 105 with the lid 111 resulting in an intelligent lid 150; and
  closing and blocking the case body 110 with the intelligent lid 150 by means of the press-fits 114 whose protrusions 123 exit from the intelligent lid 150 and act as output terminals of the intelligent power module 101 enabling the connection of the power circuit board 102 with the outside world.

Figure 4:
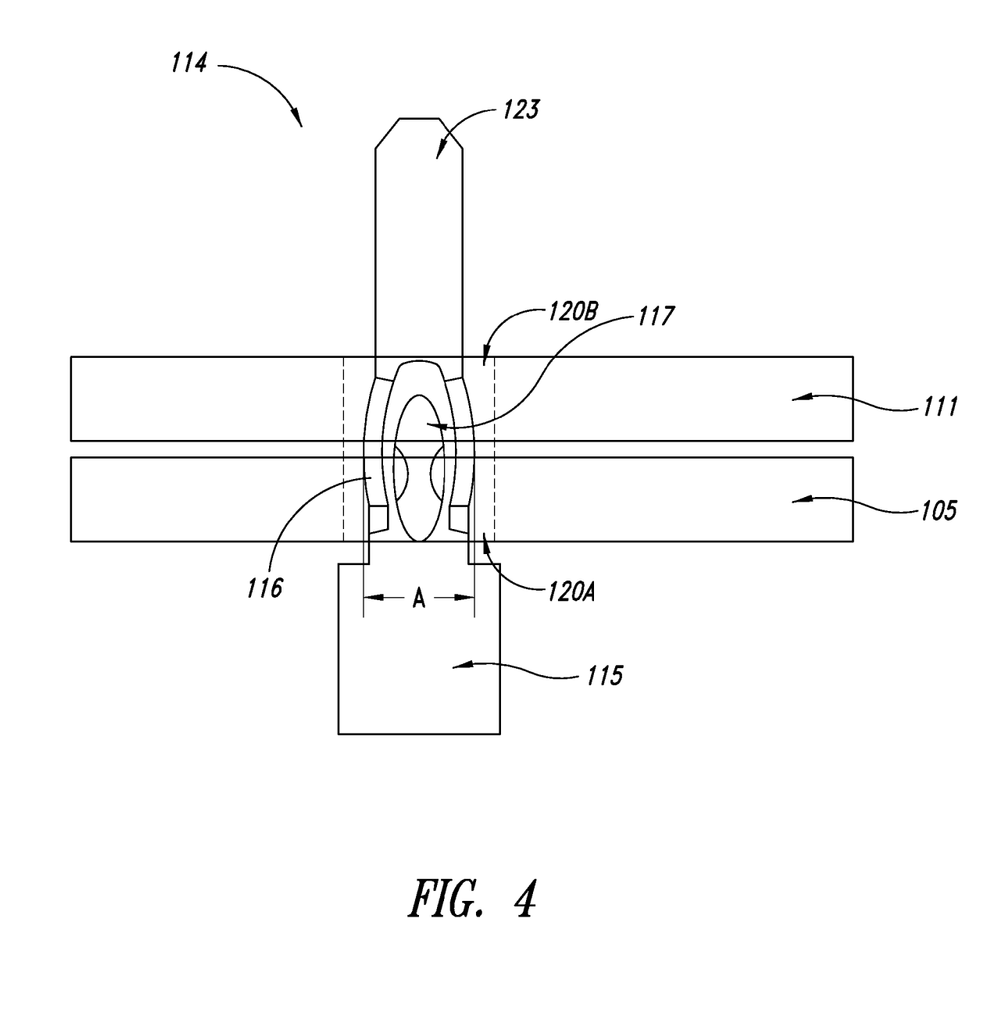
FIG. 4 schematically shows a cross section of a press-fit connector being used for assembling the intelligent power module, according to the first embodiment of the disclosure.

FIG. 4 shows a schematic view of a press-fit 114 being pressed inside corresponding metalized holes 120A, 120B of the control circuit board 105 and the lid 111, respectively. The press-fit 114 is formed by a needle 116 having one eye 117, which has a greater diameter A when pressed and enlarged into the metalized holes 120A, 120B than in a resting condition, this deformation providing a spring force which ensure the gas-tight electrical connection between the press-fits 114 and the corresponding metalized holes 120. The body 115 remains inside the intelligent power module 101, in particular in the case body 110 over the power circuit board 105, the provided bonding wires 108 electrically connecting it with the control circuit board 105 bonded to the lid 111.

Moreover, the protrusions 123 of the press-fits 114, which exit from the lid 111, after the closure step which realizes the protective case 100 of the intelligent power module 101, act as output terminals of the intelligent power module 101 itself, these output terminals enabling the connection of the power circuit board 102 to the outside world, in particular allowing an end-user to connect the intelligent power module to a load, such as a motor, for instance by providing suitable external wires bonded to these output terminals. Alternatively, these output terminals may be directly used to connect the intelligent power module 101 to a load.

Some electrical connections between the power circuit board 102 and the control circuit board 105 may be established without the signal going out of the intelligent power module 101. This particular feature of the intelligent power module 101 according to the disclosure may be simply obtained by cutting at a lid level the protrusion 123 of the specific press-fit 114 involved.

According to an alternative embodiment of the disclosure, leads may be realized in the control circuit board in such a way to exit from the lid in correspondence of a central area thereof, in order to provide some specific signals, such as alarm signals, arriving from the control circuit board 105 without any kind of electrical connection to the power circuit board 102.

Figure 5:
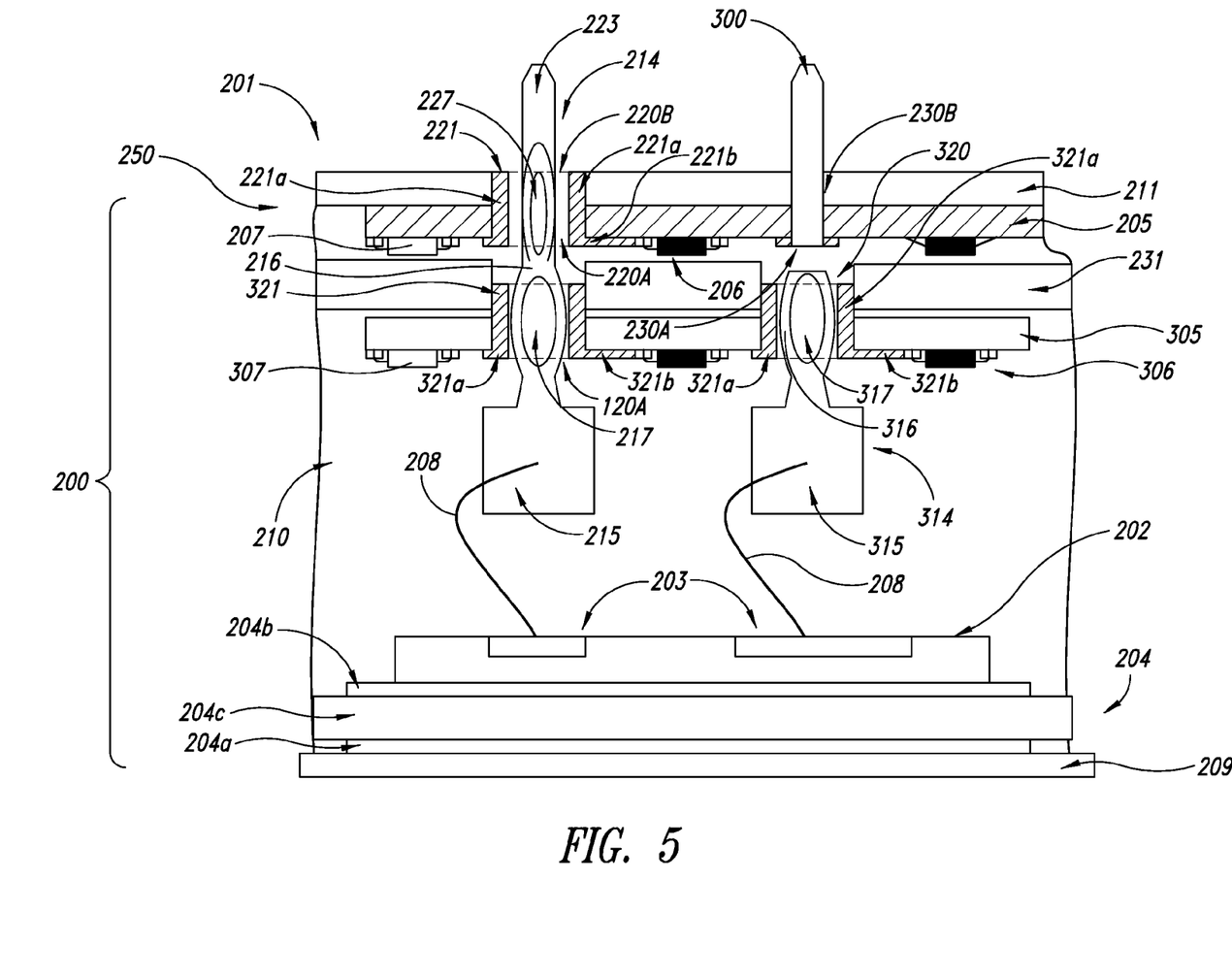
FIG. 5 schematically shows a cross section of an intelligent power module, according to a second embodiment of the disclosure.

An intelligent power module 201 according to a second embodiment of the is schematically shown in FIG. 5. The lid of the intelligent power module 201 may be provided with multiple integrated control circuit boards, or PCBs. In particular, the intelligent power module 201 may be used in case a high complexity of the control circuits is desired.

More in particular, FIG. 5 shows a cross section of the intelligent power module 201 which includes, in a similar way with respect to the intelligent power module 101 shown in FIG. 3, a power circuit board 202 equivalent to the power circuit board 102 of this first embodiment.

The intelligent power module 201 also comprises a first control circuit board 205 and a second control circuit board 305 which are used for the driving of the power devices 203 and respectively comprise, for instance, gate driver components, 206 and 306, and logic blocks, 207 and 307.

The intelligent power module 201 further includes a protective case 200, formed by a base plate 209, a case body 210, and the lid 211 to close the case body 210.

The first control circuit board 205 is attached, for instance by means of known bonding techniques, to the surface of the lid 211 facing the power circuit board 202. Moreover, an insulating layer 231 is provided on a face of the first control circuit board 205 opposite to the face of the first control circuit board facing the power circuit board 202 and the second control circuit board 305 is realized on the insulating layer 231.

In such a way an intelligent lid 250 integrating the lid 211 and the first and second control circuit boards, 205 and 305, is obtained.

According to another aspect of the disclosure, the first and second control circuit boards, 205 and 305, may be integrated in the lid 211.

The intelligent power module 201 also comprises at least a first type of press-fits 214 and a second type of press-fits 314, which are provided in correspondence with multiple positions in internal walls of the case body 210 of the protective case 200, such positions being suitably patterned in such a way to allocate the press-fits 214 and 314 at a certain distance over the power circuit board 202. Also according to this embodiment, such a distance ranges between 2 mm and 4 mm, its value being related to the voltage level that the intelligent power module 201 should sustain.

More specifically, a press-fit 214 of the first type comprises a body 215 and a needle 216 having more than one eye, in particular two eyes, 217 and 227. In particular, the body 215 may be tubular. Moreover, plane portions may be provided into the tubular body 215, in particular suitable for allowing a wire bonding of the same.

The press-fit 214 of the first type further comprises a protrusion or tip 223 extending from the needle 216 in an opposite direction with respect to the body 215.

Furthermore, a press-fit 314 of the second type comprises a body 315 and a needle 316 having one eye 317, ending in correspondence with the second printed circuit board 305. Also in this case, the body 315 may be tubular. Moreover, plane portions may be provided into the tubular body 315, in particular suitable for allowing a wire bonding of the same.

The intelligent power module 201 also comprises at least one lead 300 extending from the first control circuit board 205 toward the lid 211 as an insulated element with respect the press-fit 314 of the second type, in case in substantially corresponding positions. More in particular, the press-fit 314 of the second type may be obtained by cutting a press-fit 214 of the first type in correspondence of the first eye 217.

The press-fits, 214 and 314, are positioned in their patterned dedicated positions with at least one eye of the respective needles, 216 and 316, directed toward the lid 211 of the protective case 200 of the intelligent power module 201 and with the respective bodies, 215 and 315, directed toward the base plate 209 of this protective case 200. Moreover, the body, 215 and 315, of each press-fit, 214 or 314, is connected to at least one power device 203 of the power circuit board 202 through wires 208. Also in this case, clips (not shown) may be used.

The first printed circuit board 205 further comprises at least a first metalized hole 220A through which a press-fits 214 of the first type is pressed. In particular, the first metalized hole 220A has walls covered by rivets 221 that are substantially L-shaped and have one leg 221*a* positioned along a wall of the first metalized hole 220A and another leg 221*b* positioned on the first control circuit board 205 toward the closest gate driver component 206; in particular the second leg 221*b* is an extension made of copper able to realize an electrical connection with the gate driver component 206.

The first printed circuit board 205 further comprises at least a second, non-metalized hole 230A to house the lead 300.

Alternatively, advantageously according to another aspect of the disclosure, the first printed circuit board 205 may comprise all metalized holes.

The second printed circuit board 305 further comprises suitably metalized holes 320 through which the press-fits 214 and 314 of the first and second type are pressed. In particular, the metalized hole 320 have walls covered by rivets 321 that are substantially L-shaped and have one leg 321*a* positioned along a wall of a corresponding metalized hole 320 and another leg 321*b* positioned on the second control circuit board 305 toward the closest gate driver component 306; in particular the second leg 322 is an extension made of copper able to realize an electrical connection with the gate driver component 306.

Advantageously according to another aspect of the disclosure, both the first and second printed circuit boards 205 and 305 comprise said plurality of metalized holes 220A, 320 positioned mainly along their perimeters.

The lid 211 is also provided with holes 220B realized along its perimeter in such a way to match the holes realized in the first and second printed circuit boards, 205 and 305, when the lid 211 and the printed circuit boards are put together face by face.

In FIG. 5, the first control circuit board 205 comprises two holes, 220A and 230A, and the second control circuit board 305 comprises two holes 320 only for sake of illustration.

After its manufacturing and assembling with the first and second control circuit boards, 205 and 305, the intelligent lid 250 is put on the case body 210 to close the cavity of the protective case 200 of the intelligent power module 201. More in particular, the intelligent lid 250 is pressed on the case body 210 in such a way that the eyes 217, 227 of the needle 216 of the first type press-fit 214 pass through the metalized holes 320, 220A, and 220B, allowing the exit of its protrusion 223 as an output terminal for the connection of the power circuit board 202 to the external world. At the same time, the eye 317 of the needle 316 of the second type press fit 314 is pressed into the metalized hole 320, the second type press fit 314 being cut substantially at the level of the metalized hole 320. Moreover the lead 300 passes through the non-metalized holes 230A, 230B, in such a way to obtain an electrical connection of the second printed circuit board 305 to the power circuit board 202 through suitable circuitry realized in the first control circuit board 205, as well as first type press-fits 214. Also in this case, the mechanical blocking of the intelligent lid 250 on the case body 210 and the electrical connection between the press-fits 214 of the first type and the metalized holes 220A, 220B, and 320 and of the press-fit 314 of the second type and the second metalized hole 320 are ensured.

Figure 6:
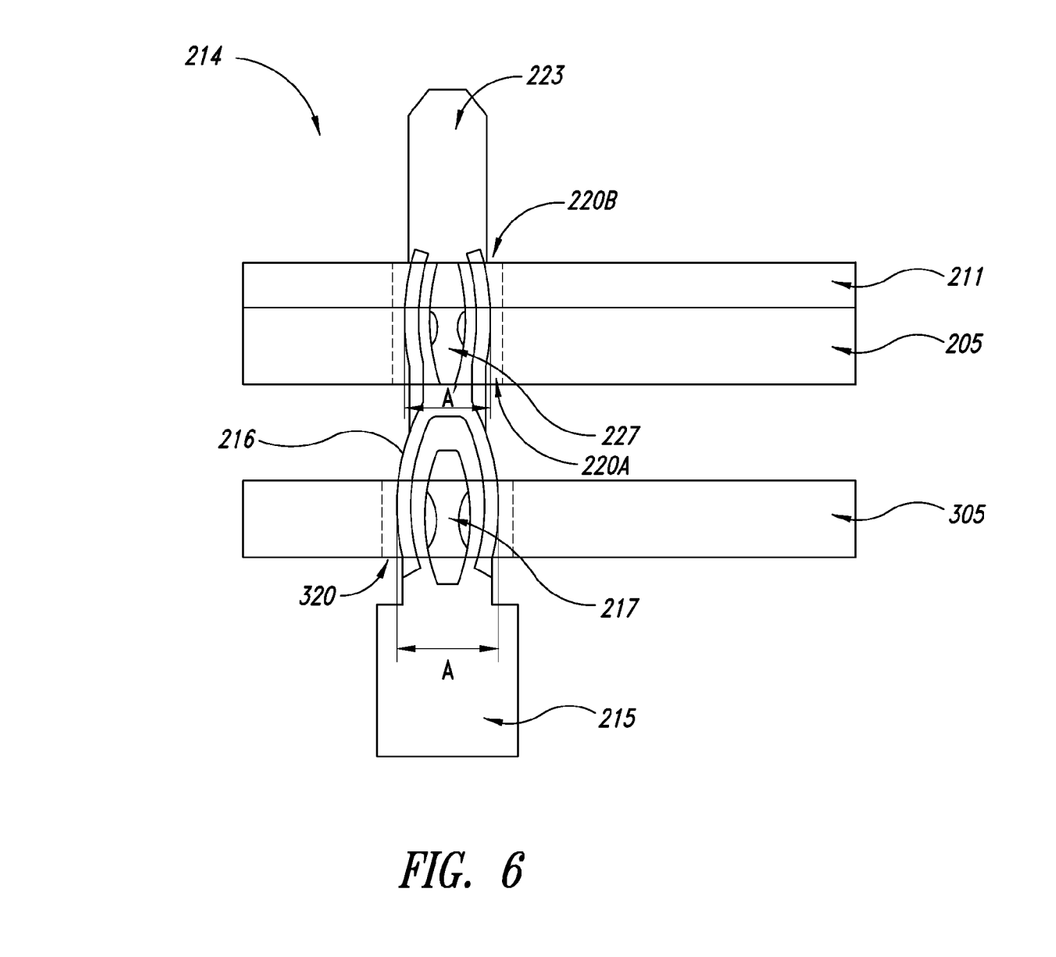
FIG. 6 schematically shows a cross section of a press-fit connector being used for assembling the intelligent power module, according to the second embodiment of the disclosure.

As an example, a press-fit 214 of the first type with a needle 216 having more than one eye which may be used in the intelligent power module 201 is shown in FIG. 6. In particular, the press-fit 214 of the first type has needle 216 with a first eye or "alo" 217 having a diameter A when pressed into a metalized hole, in particular the first metalized hole 320 of the second printed circuit board 305, and a second eye or "alo" 227 having a diameter A' in a same condition being smaller than A, the second eye 227 being pressed, for instance, into the metalized holes 220A of the first printed circuit board 205. The press-fit 214 also comprises the body 215, which would remain inside the intelligent power module 201, in particular over the power circuit board 205, and the protrusion 223, which extends from the lid 211 after the closure step, acting as an output terminal which enables the connection of the power circuit board 202 to the outside world.

In a different configuration of the second embodiment, the intelligent power module 201 comprises only press-fits 214 of the first type with needles 216 having two eyes, 217 and 227, which pass through the first and second printed circuit boards, 205 and 305, the corresponding protrusions 223 realizing output terminals which go out of the lid 211.

According to a further aspect of the disclosure, the intelligent power module 101 or 201 further comprises a galvanic isolation block 112 so as to realize a galvanic intelligent power module.

In particular, the galvanic isolation block is inserted in the control circuit board, 105, 205 and/or 305.

In this way, the number of components to be connected to the intelligent power module in a system using it would be drastically reduced.

The advantages that the present intelligent power module and the corresponding assembling method emerge clearly from the foregoing discussion.

In particular, advantageously according to the present disclosure, the connection of the control circuit board with different points inside the case body of the intelligent power module is obtained, allowing an easy integration of the circuits for the realization of an intelligent power module also in case of really complex control circuits.

In addition, advantageously according to the disclosure, it is possible to eliminate a level of wire bonding connections inside the intelligent power module.

Another advantage relates to the possibility of providing different power modules using a same device and changing only the lid of the case body, easily obtaining different intelligent power modules reducing the fabrication costs.

Obviously, a technician of the field, aiming at meeting incidental and specific needs, will bring several modifications to the above described module and method, all within the scope of protection of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An intelligent power module, comprising:
a protective case that includes a case body, a base plate, and a lid that covers an opening of the case body;
a power circuit board including a plurality of power devices and fixed on the base plate;
a first control circuit board configured to drive said power devices of said power circuit board, said first control circuit board being associated with said lid of the protective case in such a way that said first control circuit board is comprised within the opening in the case body, wherein said first control circuit board includes a first plurality of through-holes and said lid includes a second plurality through-holes respectively aligned with said through-holes of said first plurality; and
press-fits of a first type positioned partially in internal walls of said case body and extending respectively through the first plurality of through-holes and respectively through the second plurality of through-holes, each press fit of the first type having a body, a needle with an eye, and a protrusion extending from the needle in an opposite direction with respect to said body, said body being directed toward and electrically coupled to said power circuit board, said protrusions extending outside of the lid and being configured to electrically couple said power circuit board to circuitry outside of the intelligent power module.

2. An intelligent power module according to claim 1, further comprising a plurality of wires electrically coupling the bodies of the press-fits of a first type to the power devices of the power circuit board, respectively.

3. An intelligent power module according to claim 1, wherein at least some of said through-holes are metalized.

4. An intelligent power module according to claim 1, wherein all of the through-holes are metalized.

5. An intelligent power module according to claim 1, further comprising a plurality of rivets that are substantially L-shaped and each have one leg positioned along a wall of a respective one of the through-holes and another leg positioned on said first control circuit board.

6. An intelligent power module according to claim 1, wherein the first control circuit board has a first face attached to a surface of said lid facing said power circuit board, said the intelligent power module further comprising:
an insulating layer positioned on a second face of said first control circuit board, the second face being opposite to the first face; and
a second control circuit board positioned on said insulating layer.

7. An intelligent power module according to claim 1, wherein at least one of said power circuit board and first control circuit board is in the form of a printed circuit board.

8. An intelligent power module according to claim 1, further comprising a direct copper bond substrate that includes a substrate body and first and second metallic layers on opposite sides of the substrate body, said second metallic layer being in contact with said power circuit board.

9. An intelligent power module according to claim 1, wherein said power circuit board is positioned on a central area of a surface of said base plate and occupies between 75% and 95% of the surface.

10. An intelligent power module according to claim 1, further comprising a galvanic isolation block.

11. An intelligent power module according to claim 1, wherein said first control circuit board comprises output terminals extending through said lids.

12. An intelligent power module according to claim 1, wherein said first control circuit board is integrated inside said lid.

13. An intelligent power module according to claim 6, further comprising:
press-fits of a second type positioned partially in the internal walls of said case body, said press fits of the second type each having a body and a needle with at least one eye, said body being directed toward and electrically coupled to said power circuit board.

14. An intelligent power module according to claim 10, wherein said galvanic isolation block is positioned in said first control circuit board.

15. An intelligent power module according to claim 13, further comprising leads extending from said first control circuit board, passing through said second plurality of through-holes and emerging from the lid.

16. A method for assembling an intelligent power module comprising:
forming a protective case that includes a case body, a base plate, and a lid that covers an opening of the case body;
forming a power circuit board including a plurality of power devices and fixed on the base plate;
forming a first control circuit board configured to drive said power devices of said power circuit board, said first control circuit board being associated with said lid of the protective case in such a way that said first control circuit board is comprised within the opening in the case body, wherein said first control circuit board includes a first plurality of through-holes and said lid includes a second plurality through-holes respectively aligned with said through-holes of said first plurality;
positioning press-fits of a first type partially in the internal walls of said case body, each press fit of a first type having a body, a needle with an eye, and a protrusion extending from the needle in an opposite direction with respect to said body, said body being directed toward and electrically coupled to said power circuit board, said protrusions extending outside of the lid and being configured to electrically couple said power circuit board to circuitry outside of the intelligent power module; and
closing said case body with said lid by extending said press-fits respectively through the first plurality of through-holes and respectively through the second plurality of through holes.

17. The method according to claim 16, wherein said press-fits are fixed at a certain distance over said power circuit board, said distance being related to the working voltage level of the intelligent power module.

18. The method according to claim 16, wherein closing said case body with said lid comprises pressing said lid on said case body in such a way that the eyes of the needles of the press-fits are pushed in said through-holes, resulting in a gas-tight electrical connection between said press-fit and said through-holes.

19. The method according to claim 16, comprising:
forming a non-metalized hole in the lid;
forming a second control circuit board coupled to the first control circuit board; and
forming a lead electrically coupled to the second control circuit board, wherein closing said case body with said lid comprises pressing said lid on said case body in such a way that the lead passes through the non-metalized hole of said lid.

20. The method according to claim 16, comprising associating said first control circuit board with said lid by bonding said first control circuit board to a surface of said lid facing said power circuit board.

21. The method according to claim 16, comprising associating said first control circuit board with said lid by:
bonding the first control circuit board to a surface of said lid facing said power circuit board;
forming an insulating layer on said first control circuit board; and
bonding a second control circuit board on said insulating layer.

22. The method according to claim 16, comprising associating said first control circuit board with said lid by integrating said first control circuit board inside said lid.

23. The method according to claim 16, comprising inserting a galvanic isolation block in said first control circuit board.

24. An intelligent power module, comprising:
a protective case that includes a case body, a base plate, and a lid that covers an opening of the case body;
a power circuit board including a plurality of power devices and fixed on the base plate;
a first control circuit board configured to drive said power devices of said power circuit board, said first control circuit board having a first face attached to a surface of said lid facing said power circuit board and being associated with said lid of the protective case in such a way that said first control circuit board is comprised within the opening in the case body;
an insulating layer positioned on a second face of said first control circuit board, the second face being opposite to the first face; and
a second control circuit board positioned on said insulating layer and between the first control circuit board and the power circuit board, and further comprising leads extending from said first control circuit board, passing through a second plurality of through-holes in the lid and emerging from the lid.

25. An intelligent power module according to claim 24, wherein at least one of said power circuit board and first control circuit board is in the form of a printed circuit board.

26. An intelligent power module according to claim 24, further comprising a direct copper bond substrate that includes a substrate body and first and second metallic layers on opposite sides of the substrate body, said second metallic layer being in contact with said power circuit board.

* * * * *